United States Patent
Lee

(10) Patent No.: US 10,840,315 B2
(45) Date of Patent: Nov. 17, 2020

(54) DISPLAY DEVICE

(71) Applicant: Samsung Display Co., Ltd., Yongin-Si (KR)

(72) Inventor: Hyunwoo Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/454,171

(22) Filed: Jun. 27, 2019

(65) Prior Publication Data

US 2020/0111852 A1   Apr. 9, 2020

(30) Foreign Application Priority Data

Oct. 5, 2018 (KR) .......................... 10-2018-0119308

(51) Int. Cl.
*H01L 27/32* (2006.01)
*H01L 51/52* (2006.01)

(52) U.S. Cl.
CPC ...... *H01L 27/3246* (2013.01); *H01L 27/3248* (2013.01); *H01L 27/3258* (2013.01); *H01L 51/5206* (2013.01); *H01L 51/5221* (2013.01)

(58) Field of Classification Search
CPC ............. H01L 27/3246; H01L 27/3248; H01L 27/3258; H01L 51/5206; H01L 51/5221
See application file for complete search history.

(56) References Cited

U.S. PATENT DOCUMENTS

| | | | |
|---|---|---|---|
| 6,087,196 A | 7/2000 | Sturm et al. | |
| 8,435,810 B2 * | 5/2013 | Lee ..................... | H01L 27/3246 257/E21.561 |
| 9,305,983 B2 | 4/2016 | Kim et al. | |
| 9,929,221 B2 | 3/2018 | Kim et al. | |
| 2019/0172819 A1 * | 6/2019 | Bae ....................... | H01L 25/167 |

FOREIGN PATENT DOCUMENTS

| | | |
|---|---|---|
| CN | 107579105 A | 1/2018 |
| CN | 107623083 A | 1/2018 |
| KR | 10-0546921 B1 | 1/2006 |
| KR | 10-2016-0029243 A | 3/2016 |
| KR | 10-2017-0003844 A | 1/2017 |

\* cited by examiner

*Primary Examiner* — Fernando L Toledo
*Assistant Examiner* — Valerie N Newton
(74) *Attorney, Agent, or Firm* — Innovation Counsel LLP

(57) ABSTRACT

A display substrate includes: a pixel-defining layer located on the display substrate and including a plurality of light-emitting regions; and a plurality of light-emitting devices located in the plurality of light-emitting regions, respectively, wherein each of the plurality of light-emitting devices includes a pixel electrode, a common electrode, and an organic light-emitting portion between the pixel electrode and the common electrode, wherein the pixel-defining layer includes a first inner side surface and a second inner side surface facing each other in each of the plurality of light-emitting regions, and the pixel electrode is on the first inner side surface and the common electrode is on the second inner side surface.

20 Claims, 4 Drawing Sheets

DISPLAY DEVICE

CROSS-REFERENCE TO RELATED APPLICATION

This application claims the benefit of Korean Patent Application No. 10-2018-0119308, filed on Oct. 5, 2018, in the Korean Intellectual Property Office, the disclosure of which is incorporated herein in its entirety by reference.

BACKGROUND

1. Field

One or more embodiments relate to a display device.

2. Description of the Related Art

As a display field for visually expressing various electrical signal information has been rapidly developed, various flat panel display devices having excellent characteristics such as thinness, light weight, and low power consumption have been introduced. Since an organic light-emitting display device requires no separate light source, the organic light-emitting display device may be driven with a low voltage and may exhibit excellent characteristics including a wide viewing angle, high contrast, and fast response speed. Therefore, the organic light-emitting display device is being spotlighted as a next-generation display device.

The organic light-emitting display device includes an organic light-emitting device having an organic emission layer between a pair of electrodes and emits light as excitons generated by combining holes and electrons supplied from the pair of electrodes in the organic emission layer falls from an exited state to a ground state. Meanwhile, the pair of electrodes may further include functional layers for injecting and transporting electrons or holes in addition to metal electrodes. Such functional layers may be formed by an inkjet method.

However, because a conventional organic light-emitting device has a structure in which a pair of electrodes and an organic emission layer therebetween are sequentially stacked, when functional layers are formed by an inkjet method, it is difficult for the functional layers to be formed in a uniform thickness in a light-emitting region due to the difference in surface tension between ink and another insulating layer defining the light-emitting region, the drying speed of ink between a central portion and an outer portion of the light-emitting region, or the like, and therefore, luminance unevenness may occur in the light-emitting region.

SUMMARY

One or more embodiments include a display device including an organic light-emitting device having a novel structure in which luminance uniformity of a light-emitting region is improved.

Additional aspects will be set forth in part in the description which follows and, in part, will be apparent from the description, or may be learned by practice of the presented embodiments.

According to one or more embodiments, a display device includes: a display substrate; a pixel-defining layer located on the display substrate and including a plurality of openings exposing a plurality of light-emitting regions; and a plurality of light-emitting devices located in the plurality of light-emitting regions, respectively, wherein each of the plurality of light-emitting devices includes a pixel electrode, a common electrode, and an organic light-emitting portion between the pixel electrode and the common electrode, wherein the pixel-defining layer includes a first inner side surface and a second inner side surface facing each other in each of the plurality of light-emitting regions, and the pixel electrode is on the first inner side surface and the common electrode is on the second inner side surface.

The display device may further include: a barrier rib located in each of the plurality of light-emitting regions, partitioning each of the plurality of light-emitting regions into a first area and a second area, and having a height less than a thickness of the pixel-defining layer, wherein the pixel electrode is located in the first area and the common electrode is located in the second area.

In each of the plurality of light-emitting regions, the pixel-defining layer may further include a third inner side surface and a fourth inner side surface which connect the first inner side surface to the second inner side surface and face each other, and the barrier rib extends from the third inner side surface to the fourth inner side surface.

The second electrode may extend on an upper surface of the pixel-defining layer and is integrally formed with the plurality of light-emitting devices.

The second electrode may include a plurality of openings overlapping overlap the plurality of light-emitting regions and are larger than the plurality of light-emitting regions. each of the plurality of openings may be spaced apart from the first inner side surface, the third inner side surface, and the fourth inner side surface at the upper surface of the pixel-defining layer.

The display device may further include: a first functional layer between the pixel electrode and the organic light-emitting portion and a second functional layer between the common electrode and the organic light-emitting portion.

The first functional layer may be located in the first area, the second functional layer may be located in the second area and the organic light-emitting portion may be continuously located over the first area and the second area.

The first functional layer may include a hole injection layer and a hole transport layer, and the second functional layer may include an electron injection layer and an electron transport layer.

Each of the first functional layer and the second functional layer may have a constant thickness at a height equal to or greater than the barrier rib.

The display substrate may include a base substrate, a thin-film transistor on the base substrate, and a passivation layer on the thin-film transistor, wherein the pixel-defining layer may be located on the passivation layer, and the first electrode extends on a bottom surface of the first area and is electrically connected to the thin-film transistor through a contact hole.

The second electrode may extend on an upper surface of the pixel-defining layer and may be integrally formed with the plurality of light-emitting devices.

The second electrode may include a plurality of openings overlapping the plurality of light-emitting regions and larger than the plurality of light-emitting regions, and each of the plurality of openings may be spaced apart from the first inner side surface, the third inner side surface, and the fourth inner side surface at the upper surface of the pixel-defining layer.

According to one or more embodiments, a display device including: a display substrate; a pixel-defining layer located on the display substrate and including a plurality of openings exposing a plurality of light-emitting regions; a barrier rib located in each of the plurality of light-emitting regions and partitioning each of the plurality of light-emitting regions into a first area and a second area; and a plurality of light-emitting devices located in the plurality of light-emitting regions, respectively, wherein each of the plurality of light-emitting devices includes a first electrode and a second electrode arranged to face each other, and the first electrode is located in the first area, and the second electrode is located in the second area.

In each of the plurality of light-emitting regions, the pixel-defining layer may further include a first inner side surface and a second inner side surface facing each other, and a third inner side surface and a fourth inner side surface which connect the first inner side surface to the second inner side surface and face each other, and the barrier rib may extend from the third inner side surface to the fourth inner side surface.

The first electrode may be located on the first inner side surface and the second electrode may be located on the second inner side surface.

The display device may further include: a first functional layer on the first electrode, a second functional layer on the second electrode, and an organic light-emitting portion between the first functional layer and the second functional layer.

A height of the barrier rib may be less than a thickness of the pixel-defining layer, and each of the first functional layer and the second functional layer may have a constant thickness at a height equal to or greater than the barrier rib.

The first functional layer may cover a surface of the first electrode and a first side of the surface of the barrier rib facing the first electrode, the second functional layer may cover a surface of the second electrode and a second side of the surface of the barrier rib facing the second electrode, the first functional layer and the second functional layer may be separated from each other by the barrier rib, and the organic light-emitting portion may be continuously located over the first area and the second area.

The display substrate may include a base substrate, a thin-film transistor on the base substrate, and a passivation layer on the thin-film transistor, and the pixel-defining layer may be on the passivation layer.

The first electrode may extend on a bottom surface of the first area and may be electrically connected to the thin-film transistor through a contact hole of the first area.

The second electrode may extend on an upper surface of the pixel-defining layer and may be integrally formed with the plurality of light-emitting devices.

The plurality of openings overlap the plurality of light-emitting regions, and each of the plurality of openings may be separated from the first inner side surface, the third inner side surface, and the fourth inner side surface at the upper surface of the pixel-defining layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
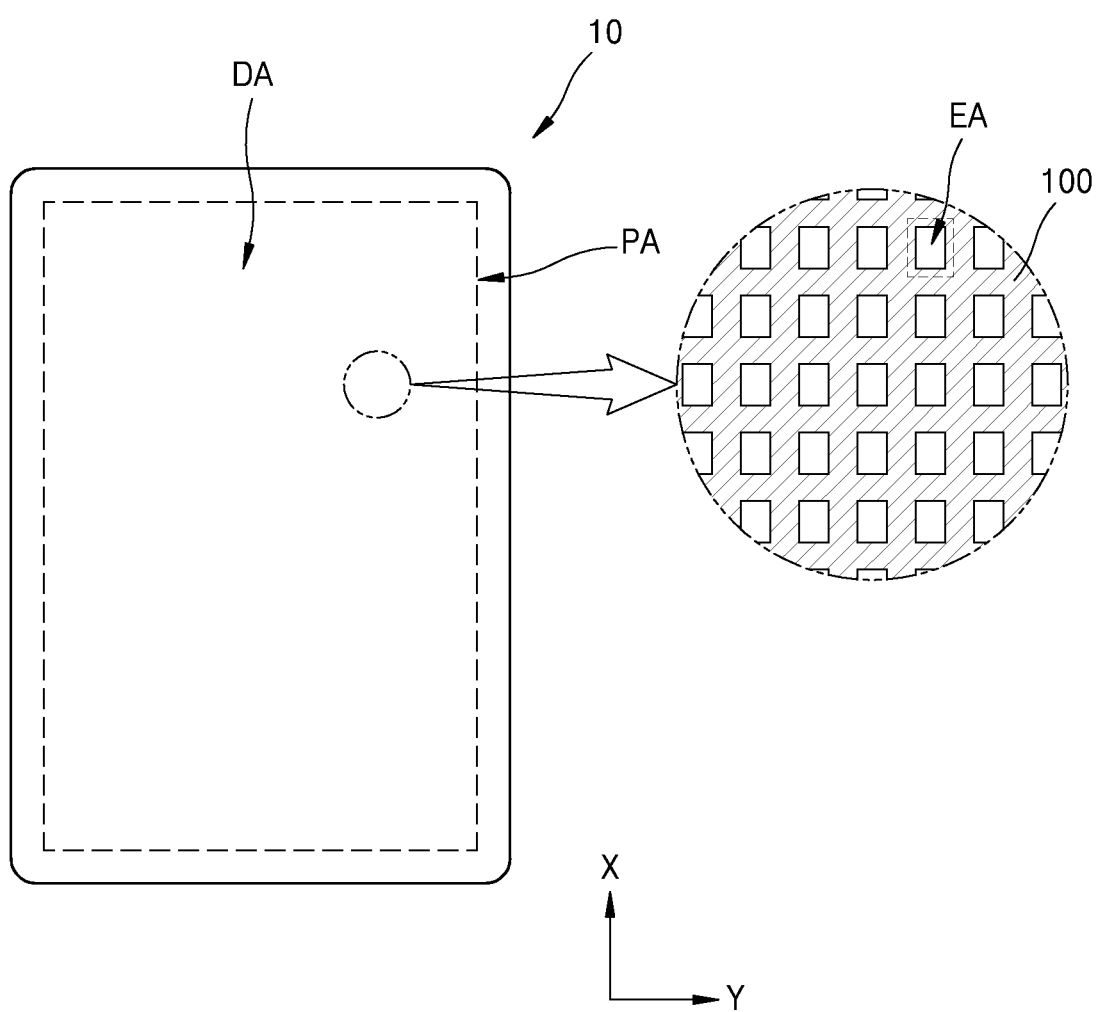
FIG. 1 is a plan view schematically showing an embodiment of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that although the terms "first", "second", etc. may be used herein to describe various components, these components should not be limited by these terms.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, embodiments will be described in detail with reference to the accompanying drawings. The same reference numerals are used to denote the same elements.

FIG. 1 is a plan view schematically showing an embodiment of a display device according to an embodiment.

Referring to FIG. 1, a display device 10 according to an embodiment has a display area DA in which an image is displayed and a peripheral area PA located outside the display area DA.

A plurality of light-emitting regions EA may be located in the display area DA. The plurality of light-emitting regions EA may be separated from each other in a first direction X and a second direction Y and light-emitting devices may be located in the plurality of light-emitting regions EA. The plurality of light-emitting regions EA may be included in a pixel-defining layer 100.

The peripheral area PA includes a pad region which is a region where various electronic devices or printed circuit boards are electrically connected, and a plurality of wirings for transmitting electrical signals to be applied to the light-emitting devices located in the light-emitting regions EA may be located in the peripheral area PA.

Figure 2:
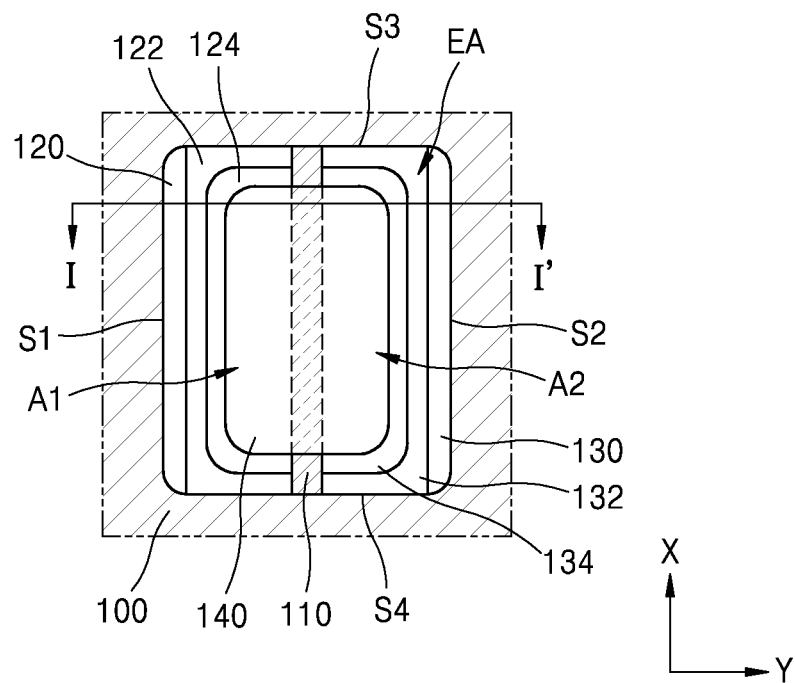
FIG. 2 is a plan view schematically showing an example of one light-emitting region in the display device of FIG. 1.
Figure 3:
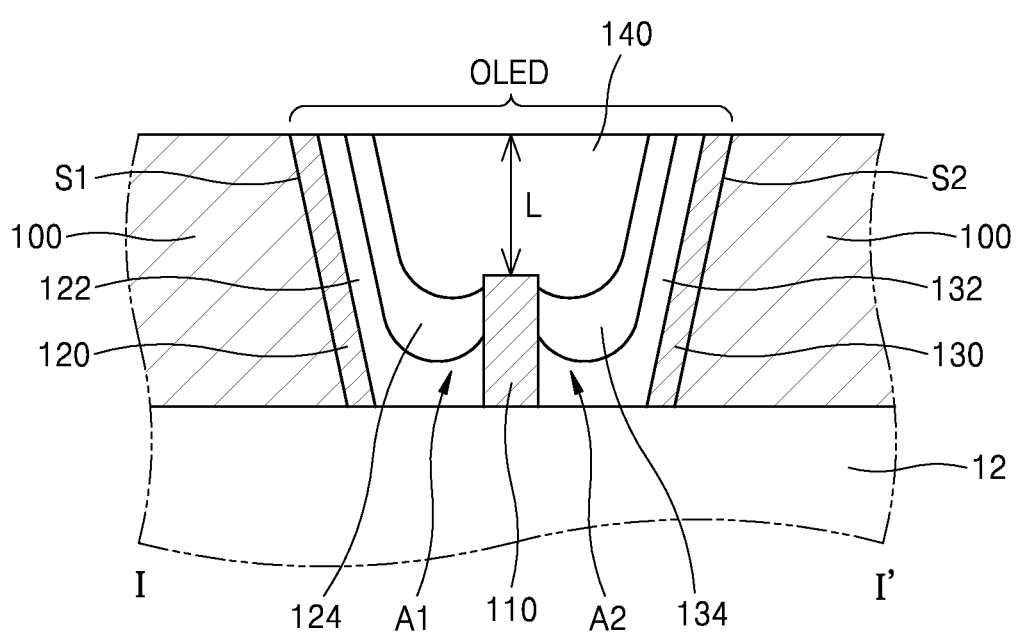
FIG. 3 is a cross-sectional view schematically showing an example of a cross-section taken along line I-I' of FIG. 2.

FIG. 2 is a plan view schematically showing an example of one light-emitting region in the display device 10 of FIG. 1, and FIG. 3 is a cross-sectional view schematically showing an example of a cross-section taken along line I-I' of FIG. 2. Although FIGS. 2 and 3 show one light-emitting region, a plurality of light-emitting regions may all have an identical structure.

Referring to FIGS. 2 and 3, the pixel-defining layer 100 is disposed on the display substrate 12. The pixel-defining layer 100 may include at least one organic insulating material of polyimide, polyamide, acrylic resin, benzocyclobutene (BCB), and phenolic resin, and may be formed by spin coating.

The light-emitting region EA surrounded by the pixel-defining layer 100 has a concave shape. A light-emitting device may be located in the light-emitting region EA having a concave shape. The light-emitting device may be, for example, an organic light-emitting device OLED including an organic light-emitting portion 140. Meanwhile, the display substrate 12 may include a thin-film transistor electrically connected to the organic light-emitting device OLED.

The light-emitting region EA, for example, may have a substantially rectangular shape when viewed in a plan view. To this end, the pixel-defining layer 100 may include a first inner side surface S1 and a second inner side surface S2 facing each other in the light-emitting region EA. Furthermore, the pixel-defining layer 100 may include a third inner side surface S3 and a fourth inner side surface S4 which connect the first inner side surface S1 to the second inner side surface S2 and face each other in the light-emitting region EA. That is, the light emitting region EA may be defined as a region partitioned by the first inner side surface S1 to the fourth inner side surface S4. Meanwhile, the light-emitting region EA may have a rounded corner portion. For example, the first inner side surface S1 and the third inner side surface S3 do not vertically intersect and the intersection of the first inner side surface S1 and the third inner side surface S3 may be rounded.

A barrier rib 110 may be located in the light-emitting region EA to partition the light-emitting region EA into a first area A1 and a second area A2. The barrier rib 110 may extend from the third inner side S3 to the fourth inner side S4 of the pixel defining layer 100 and may have a height less than the thickness of the pixel defining layer 100. The barrier rib 110 may include the same material as that of the pixel-defining layer 100 and may be formed simultaneously with the pixel-defining layer 100.

The organic light emitting device OLED may include a first electrode 120, a second electrode 130, and the organic light-emitting portion 140 between the first electrode 120 and the second electrode 130. The organic light emitting device OLED may further include first functional layers 122 and 124 between the first electrode 120 and the organic light-emitting portion 140 and second functional layers 132 and 134 between the second electrode 130 and the organic light-emitting portion 140.

The first electrode 120 and the second electrode 130 are arranged to face each other. The first electrode 120 is located in the first area A1 and the second electrode 130 is located in the second area A2. For example, the first electrode 120 is located on the first inner side surface S1 and the second electrode 130 is located on the second inner side surface S2 so that they may face each other in a horizontal direction. Therefore, the first electrode 120 and the second electrode 130 need not have a transparent property. For example, the first electrode 120 and the second electrode 130 may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

The first functional layers 122 and 124 may be on the first electrode 120. For example, the first electrode 120 may be a pixel electrode and the first functional layers 122 and 124 may include a hole injection layer 122 and a hole transport layer 124. The first functional layers 122 and 124 may be formed by, for example, an inkjet method. Accordingly, the first functional layers 122 and 124 may cover a surface of the first electrode 120 and a first side of a surface of the barrier rib 110 facing the first electrode 120. A center portion between the first electrode 120 and the barrier rib 110 may have a concave shape while being dried.

The second functional layers 132 and 134 may be on the second electrode 130. For example, the second electrode 130 may be a common electrode, and the second functional layers 132 and 134 may include an electron injection layer 132 and an electron transport layer 134. The second functional layers 132 and 134 may be formed by an inkjet method in the same manner as the first functional layers 122 and 124. Accordingly, the second functional layers 132 and 134 may cover the surface of the second electrode 130 and a second side of the surface of the barrier rib 110 facing the second electrode 130. A center portion between the second electrode 130 and the barrier rib 110 may have a concave shape.

That is, the first functional layers 122 and 124 and the second functional layers 132 and 134 are separated from each other by the barrier rib 110 so that the first functional layers 122 and 124 may be located in the first area A1 and the second functional layers 132 and 134 may be located in the second area A2.

The organic light-emitting portion 140 may include a low-molecular organic material or a high-molecular organic material and may be continuously located over the first area A1 and the second area A2. Accordingly, the organic light-emitting portion 140 is also located on the barrier rib 110.

Meanwhile, as described above, the first functional layers 122 and 124 are formed by an inkjet method, and may have a uniform thickness on the first electrode 120. In more detail, since the first functional layers 122 and 124 may have a concave shape at the central portion of the first area A1, at least the first functional layers 122 and 124 may have a constant thickness at a height equal to or greater than the barrier rib 110. Likewise, the second functional layers 132 and 134 may have a constant thickness at the height equal to or greater than the barrier rib 110.

That is, since the first functional layers 122 and 124 and the second functional layers 132 and 134 have a constant thickness at the height equal to or greater than the barrier rib 110 in a horizontal direction and holes and electrons are injected into the organic light-emitting portion 140 from the first electrode 120 and the second electrode 130, respectively, which have a constant thickness of the first functional layers 122 and 124 and the second functional layers 132 and 134. A total thickness of the first functional layers 122 and 124 and the second functional layers 132 and 134 contacting the barrier rib 110 may have a thickness less than a height of the barrier rib 110. Therefore, the organic light emitting device OLED may have a uniform luminance throughout the light-emitting region EA.

Figure 4:
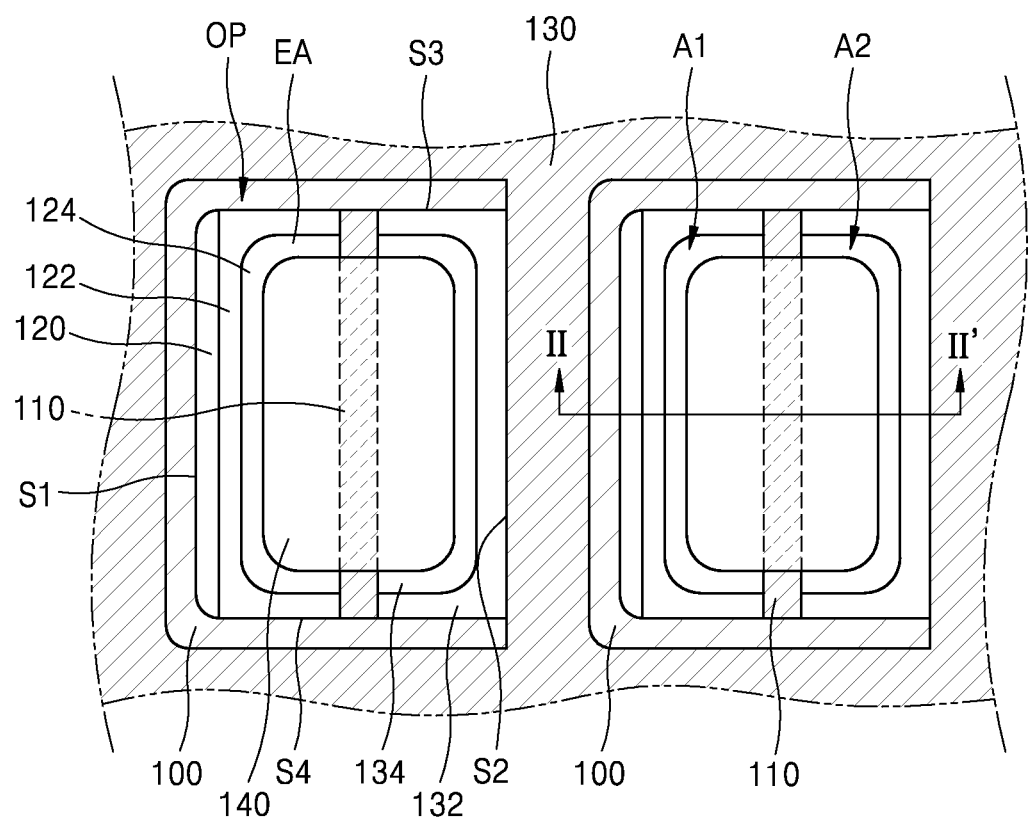
FIG. 4 is a plan view schematically showing another example of one light-emitting region in the display device of FIG. 1.
Figure 5:
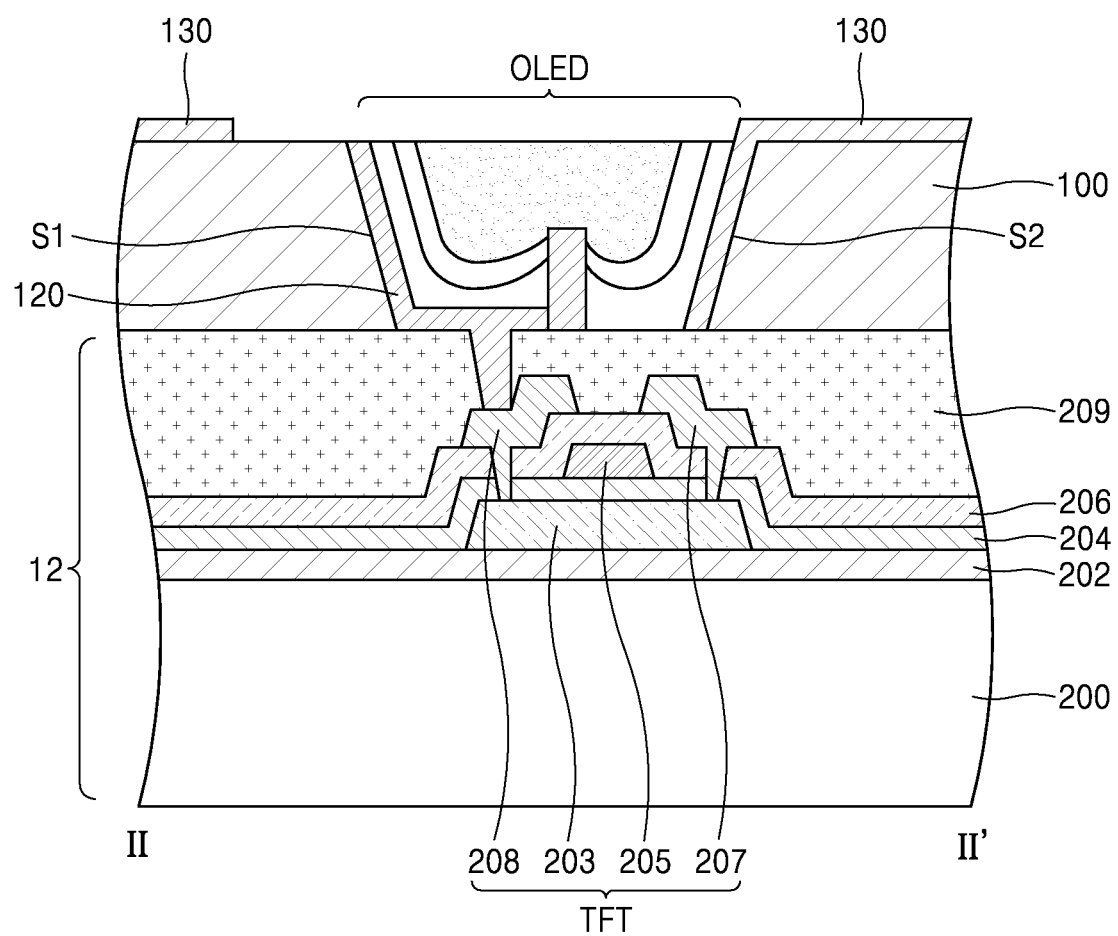
FIG. 5 is a cross-sectional view schematically showing an example of a cross-section taken along line II-II' of FIG. 4.

FIG. 4 is a plan view schematically showing another example of one light-emitting region in the display device 10 of FIG. 1, and FIG. 5 is a cross-sectional view schematically showing an example of a cross-section taken along line II-II' of FIG. 4.

Referring to FIGS. 4 and 5, the display substrate 12 may include a base substrate 200, and a thin-film transistor TFT on the base substrate 200. The thin film transistor TFT may be electrically connected to the organic light emitting device OLED. The display substrate 12 of FIG. 3 may have the same configuration as the display substrate 12 of FIG. 5 which will be described hereinafter.

The base substrate 200 may include transparent glass mainly including silicon oxide film ($SiO_2$). However, the base substrate 200 is not limited thereto, and may include transparent plastic materials. Plastic materials forming the base substrate 200 may be insulating organic materials selected from a group formed of organic materials such as polyethersulfone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC) and cellulose acetate propionate (CAP).

Meanwhile, when a type of an image is a bottom-emission type produced in a direction of the base substrate 200, the base substrate 200 may include transparent materials. However, when a type of the image is a top-emission type produced in a direction opposite to the base substrate 200, the base substrate 200 does not necessarily include transparent materials. In this case, the base substrate 200 may include metal. When the base substrate 200 includes metal, the base substrate 200 may include, but is not limited to, at least one selected from a group of carbon (C), iron (Fe), chromium (Cr), manganese (Mn), nickel (Ni), titanium (Ti), molybdenum (Mo), and stainless steel (SUS).

A buffer layer 202 may be formed on the base substrate 200 to prevent impurities from penetrating into an active layer 203 of the thin-film transistor TFT. The buffer layer 202 may include an inorganic material such as silicon oxide (SiOx), silicon nitride (SiN), silicon oxy-nitride (SiON), aluminum oxide ($Al_2O_3$), aluminum nitride (AlN), titanium oxide ($TiO_2$)) or titanium nitride (TiON), an organic material such as polyimide, polyester or acryl, or a plurality of laminates thereof.

The thin-film transistor TFT may include the active layer 203, a gate electrode 205, a source electrode 207, and a drain electrode 208. Hereinafter, it is assumed that a type of the thin-film transistor TFT is a top-gate type, wherein the active layer 203, the gate electrode 205, the source electrode 207, and the drain electrode 208 are sequentially formed in this stated order. However, the present example embodiment is not limited thereto, and the thin-film transistor TFT may be of various types such as a bottom-gate type.

The active layer 203 may include semiconductor materials such as amorphous silicon or polycrystalline silicon. However, the present embodiment is not limited thereto and the active layer 203 may include various materials. As a selective embodiment, the active layer 203 may include an organic semiconductor material. As another selective embodiment, the active layer 203 may include an oxide semiconductor material. For example, the active layer 203 may include an oxide of a material selected from metal elements of Groups 12, 13, and 14, such as zinc (Zn), indium (In), gallium (Ga), tin (Sn), cadmium (Cd), and germanium (Ge), and a combination thereof.

A first insulating layer 204 may be formed on the active layer 203. The first insulating layer 204 is a layer for insulating the active layer 203 from the gate electrode 205, and may be a gate insulating layer. The first insulating layer 204 may include a silicon oxide or a silicon nitride.

The gate electrode 205 is on the first insulating layer 204. The gate electrode 205 may be connected to a gate line (not shown) applying on/off signals to the thin-film transistor TFT. The gate electrode 205 may include low-resistance metal. The gate electrode 205 may include at least one of materials selected from Al, Pt, Pd, Ag, Mg, Au, Ni, Nd, Ir, Cr, lithium (Li), calcium (Ca), molybdenum (Mo), titanium (Ti), tungsten (W), and copper (Cu), and may include a single layer or multiple layers.

A second insulating layer 206 may be formed on the gate electrode 205. The second insulating layer 206 insulates the source electrode 207 and the drain electrode 208 from the gate electrode 205. The second insulating layer 206 may include inorganic materials and may include a single layer or multiple layers. For example, the inorganic materials may be metal oxides or metal nitrides, and in detail, the inorganic materials may include SiOx, SiN, SiON, $Al_2O_3$, $TiO_2$, tantalum oxide ($Ta_2O_5$), or hafnium oxide ($HfO_2$).

The source electrode 207 and the drain electrode 208 are formed on the second insulating layer 206. The source electrode 207 and the drain electrode 208 may be respectively in contact with a source region and a drain region of the active layer 203 through contact holes formed in the first insulating layer 204 and the second insulating layer 206. The source electrode 207 and the drain electrode 208 may include at least one of materials selected from Al, Pt, Pd, Ag, Mg, Au, Ni, Nd, Ir, Cr, Li, Ca, Mo, Ti, W and Cu, and may include a single layer or multiple layers. For example, the source electrode 207 and the drain electrode 208 may have a three-layered structure of Ti/Al/Ti.

A passivation layer 209 may be formed so as to cover the thin-film transistor TFT. The passivation layer 209 may have a flat upper surface, and thus, may prevent defects in the display device 230 due to a step caused by the thin-film transistor TFT.

The passivation layer 209 may include $SiO_2$, silicon nitride film (SiNx), SiON, $Al_2O_3$, $TiO_2$, $Ta_2O_5$, $HfO_2$, zinc oxide ($ZrO_2$), (Ba, Sr) $TiO_3$ (BST), or lead zirconate titanate (PZT). An organic insulating layer may include a general polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. Furthermore, the passivation layer 209 may be a composite laminate of an inorganic insulating layer and an organic insulating layer.

The pixel-defining layer 100 is on the passivation layer 209. The pixel-defining layer 100 may define a plurality of light-emitting regions EA and the organic light-emitting device OLED may be on the plurality of light-emitting regions EA. Descriptions of the pixel-defining layer 100 and the organic light-emitting device OLED will not be given herein as they were described above with reference to FIGS. 2 and 3, and only the differences will be described later below.

The first electrode 120 on the first inner side surface S1 of the pixel-defining layer 100 may extend on a bottom surface of a first area and may be electrically connected to the thin-film transistor TFT through a contact hole formed on the bottom surface of the first area. The bottom surface of the first area may be a portion of an upper surface of the passivation layer 209, and the contact hole may be formed in the passivation layer 209.

The second electrode 130 on the second inner side surface S2 of the pixel-defining layer 100 extends in a direction crossing an extending direction of the first electrode 120, that is, on an upper surface of the pixel-defining layer 100. In addition, the second electrode 130 may be a common electrode, and may be integrally formed with a plurality of organic light emitting devices OLEDs. In more detail, as shown in FIG. 4, the second electrode 130 extending from the second inner side surface S2 to the upper surface of the pixel-defining layer 100 may be integrally formed to cover the entire display area DA (of FIG. 1) and may include an opening OP overlapping the light-emitting area EA. The opening OP may be formed larger than the light-emitting area EA. In more detail, as shown in FIG. 4, the second electrode 130 may prevent a short circuit between the second electrode 130 and the first electrode 120 by being separated from the first inner side surface S1, the third inner side surface S3, and the fourth inner side surface S4 on the upper surface of the pixel-defining layer 100.

A display device according to the present disclosure may improve luminance uniformity of a light-emitting region. However, the scope of the present disclosure is not limited to the effect.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a display substrate;
   a pixel-defining layer located on the display substrate and comprising a plurality of opening exposing a plurality of light-emitting regions; and
   a plurality of light-emitting devices located in the plurality of light-emitting regions, respectively,
   wherein each of the plurality of light-emitting devices comprises a pixel electrode, a common electrode, and an organic light-emitting portion between the pixel electrode and the common electrode,
   wherein the pixel-defining layer comprises a first inner side surface and a second inner side surface facing each other in each of the plurality of light-emitting regions, and
   wherein the pixel electrode is on the first inner side surface and the common electrode is on the second inner side surface.

2. The display device of claim 1, further comprising:
   a barrier rib located in each of the plurality of light-emitting regions, partitioning each of the plurality of light-emitting regions into a first area and a second area, and having a height less than a thickness of the pixel-defining layer,
   wherein the pixel electrode is located in the first area and the common electrode is located in the second area.

3. The display device of claim 2, wherein, in each of the plurality of light-emitting regions, the pixel-defining layer further comprises a third inner side surface and a fourth inner side surface which connect the first inner side surface to the second inner side surface and face each other, and the barrier rib extends from the third inner side surface to the fourth inner side surface.

4. The display device of claim 3, wherein the second electrode extends on an upper surface of the pixel-defining layer and is integrally formed with the plurality of light-emitting devices.

5. The display device of claim 4, wherein the plurality of openings overlap the plurality of light-emitting regions and are larger than the plurality of light-emitting regions, and
   each of the plurality of openings is spaced apart from the first inner side surface, the third inner side surface, and the fourth inner side surface at the upper surface of the pixel-defining layer.

6. The display device of claim 2, further comprising:
   a first functional layer between the pixel electrode and the organic light-emitting portion and a second functional layer between the common electrode and the organic light-emitting portion.

7. The display device of claim 6, wherein the first functional layer is located in the first area, the second functional layer is located in the second area, and the organic light-emitting portion is continuously located over the first area and the second area.

8. The display device of claim 6, wherein the first functional layer comprises a hole injection layer and a hole transport layer, and the second functional layer comprises an electron injection layer and an electron transport layer.

9. The display device of claim 6, wherein each of the first functional layer and the second functional layer has a constant thickness at a height equal to or greater than the barrier rib.

10. The display device of claim 2, wherein the display substrate comprises a base substrate, a thin-film transistor on the base substrate, and a passivation layer on the thin-film transistor,
    wherein the pixel-defining layer is located on the passivation layer, and
    the first electrode extends on a bottom surface of the first area and is electrically connected to the thin-film transistor through a contact hole.

11. A display device comprising:
    a display substrate;
    a pixel-defining layer located on the display substrate and comprising a plurality of openings exposing a plurality of light-emitting regions;
    a barrier rib located in each of the plurality of light-emitting regions and partitioning each of the plurality of light-emitting regions into a first area and a second area; and
    a plurality of light-emitting devices located in the plurality of light-emitting regions, respectively,
    wherein each of the plurality of light-emitting devices comprises a first electrode and a second electrode arranged to face each other, and
    wherein the first electrode is located in the first area, and the second electrode is located in the second area.

12. The display device of claim 11, wherein, in each of the plurality of light-emitting regions, the pixel-defining layer further comprises a first inner side surface and a second inner side surface facing each other, and a third inner side surface and a fourth inner side surface which connect the first inner side surface to the second inner side surface and face each other, and
    the barrier rib extends from the third inner side surface to the fourth inner side surface.

13. The display device of claim 12, wherein the first electrode is located on the first inner side surface and the second electrode is located on the second inner side surface.

14. The display device of claim 13, further comprising:
a first functional layer on the first electrode, a second functional layer on the second electrode, and an organic light-emitting portion between the first functional layer and the second functional layer.

15. The display device of claim 14, wherein a height of the barrier rib is less than a thickness of the pixel-defining layer, and
each of the first functional layer and the second functional layer has a constant thickness at a height equal to or greater than the barrier rib.

16. The display device of claim 15, wherein the first functional layer covers a surface of the first electrode and a first side of the surface of the barrier rib facing the first electrode,
the second functional layer covers a surface of the second electrode and a second side of the surface of the barrier rib facing the second electrode,
the first functional layer and the second functional layer are separated from each other by the barrier rib, and
the organic light-emitting portion is continuously located over the first area and the second area.

17. The display device of claim 13, wherein the display substrate comprises a base substrate, a thin-film transistor on the base substrate, and a passivation layer on the thin-film transistor, and
the pixel-defining layer is on the passivation layer.

18. The display device of claim 17, wherein the first electrode extends on a bottom surface of the first area and is electrically connected to the thin-film transistor through a contact hole in the first area.

19. The display device of claim 13, wherein the second electrode extends on an upper surface of the pixel-defining layer and is integrally formed with the plurality of light-emitting devices.

20. The display device of claim 19, wherein the plurality of openings overlap the plurality of light-emitting regions, and
each of the plurality of openings is separated from the first inner side surface, the third inner side surface, and the fourth inner side surface at the upper surface of the pixel-defining layer.

* * * * *